United States Patent
Kwak et al.

(10) Patent No.: US 7,145,827 B2
(45) Date of Patent: Dec. 5, 2006

(54) REFRESH CONTROL CIRCUIT AND METHOD FOR MULTI-BANK STRUCTURE DRAM

(75) Inventors: Jong-Tae Kwak, Kyoungki-do (KR); Shin-Deok Kang, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 58 days.

(21) Appl. No.: 11/020,803

(22) Filed: Dec. 22, 2004

(65) Prior Publication Data

US 2005/0237838 A1    Oct. 27, 2005

(30) Foreign Application Priority Data

Apr. 27, 2004    (KR) .................. 10-2004-0029223

(51) Int. Cl.
  *G11C 7/00*    (2006.01)
(52) U.S. Cl. .................. 365/222; 365/194; 365/230.03
(58) Field of Classification Search .................. 365/222, 365/194, 230.03
  See application file for complete search history.

(56) References Cited

U.S. PATENT DOCUMENTS 5,535,169 A * 7/1996 Endo et al. ............ 365/230.03
6,363,024 B1   3/2002 Fibranz
6,426,909 B1 * 7/2002 Tomita .................. 365/222
6,518,595 B1   2/2003 Lee
6,529,433 B1 * 3/2003 Choi .................... 365/222
6,560,155 B1 * 5/2003 Hush .................... 365/222
6,665,224 B1  12/2003 Lehmann et al.
6,859,407 B1   2/2005 Suh

FOREIGN PATENT DOCUMENTS

| JP | 2003/68073  | 3/2003 |
| JP | 2003/242800 | 8/2003 |

* cited by examiner

*Primary Examiner*—Richard Elms
*Assistant Examiner*—Toan Le
(74) *Attorney, Agent, or Firm*—Blakely Sokoloff Taylor & Zafman (57) ABSTRACT

A refresh control circuit for use in a semiconductor memory device having a plurality of banks, including: a bank number signal generator for generating a plurality of bank number signals having a predetermined delay time between generation timings of the plurality of bank number signals based on a refresh signal and a reference signal; and a bank selection unit for generating a plurality of bank selection signals in response to the plurality of bank number signals and a piled-refresh control signals to thereby refresh the plurality of banks.

13 Claims, 8 Drawing Sheets

| tm_piledref<1> | tm_piledref<0> | refresh count during tRFC | bank refresh sequence |
|---|---|---|---|
| 0 | 0 | 8times | (0),(1),(2),(3)(4),(5),(6),(7) |
| 0 | 1 | 4times | (0,1),(2,3)(4,5),(6,7) |
| 1 | 0 | 2times | (0,1,2,3)(4,5,6,7) |
| 1 | 1 | 1times | (0,1,2,3,4,5,6,7) |

REFRESH CONTROL CIRCUIT AND METHOD FOR MULTI-BANK STRUCTURE DRAM

FIELD OF INVENTION

The present invention relates to a refresh control circuit capable of controlling a refresh operation of each bank included in a semiconductor memory device and a method thereof.

DESCRIPTION OF PRIOR ART

Generally, a semiconductor memory device can be classified into two different types: one is a dynamic random access memory (DRAM) and the other is a static random access memory (SRAM).

Since a memory cell included in the SRAM is formed by four latched transistors, the SRAM can hold its data without a refresh operation as long as power is supplied to the SRAM.

On the contrary, a memory cell included in the DRAM is formed by a transistor and a capacitor; and the capacitor is charged or discharged for the DRAM operation. However, charge quantity stored in the capacitor reduces as time passes. Therefore, the DRAM must be refreshed periodically in order to hold its data contents. Generally, the DRAM consumes lots of power and requires a predetermined refresh time to perform the refresh operation.

The DRAM includes a plurality of banks, and each of the plurality of banks includes a plurality of memory cells. To complete the refresh operation, all of the plurality of banks should be refreshed. Herein, the plurality of banks can be refreshed one by one, or the plurality of banks can be grouped into predetermined numbers so that two or more banks included in a group can be refreshed at once. For instance, if it is assumed that the DRAM includes eight banks and the eight banks are grouped into four groups to be refreshed, the four groups of banks are refreshed one by one. That is, two banks are refreshed at once.

The number of banks to be refreshed at once is determined based on an external control signal. The external control signal is generated depending on various system environments such as a power supply and an operational speed.

Therefore, in response to the external control signal, the eight banks are refreshed one by one, two by two or four by four. Also, all of the eight banks can be refreshed at once.

Figure 1:
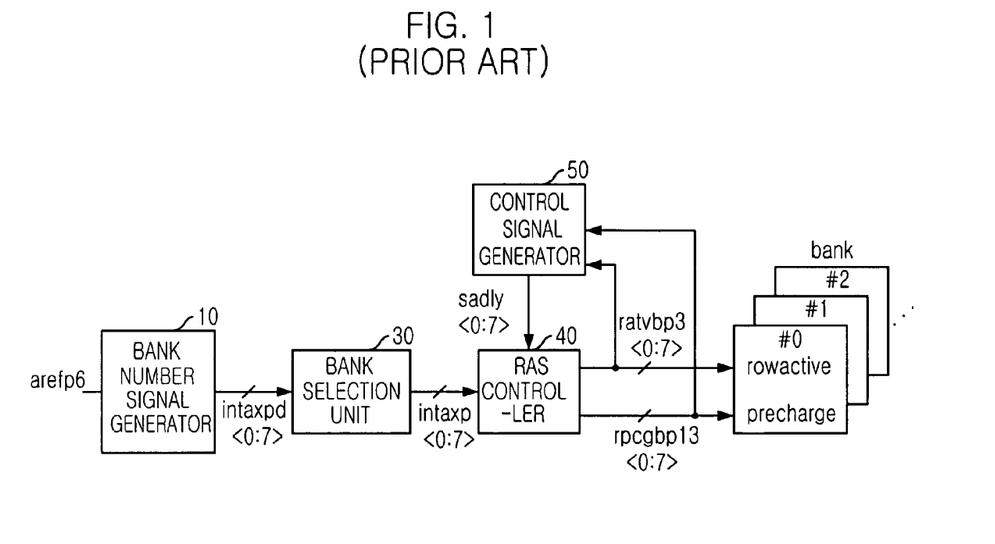
FIG. 1 is a block diagram showing a conventional refresh control circuit included in a conventional DRAM.

FIG. 1 is a block diagram showing a conventional refresh control circuit included in a conventional DRAM. Herein, it is assumed that the conventional DRAM includes eight banks. The eight banks are numbered from 0 to 7 and the bank numbered as 0 is called a first bank. As a matter of course, the other banks numbered from 1 to 7 are called a second to an eighth banks.

As shown, the conventional refresh control circuit includes a bank number signal generator 10 for generating an 8-bit bank number signal intaxpd<0:7> in response to a refresh signal arefp6; a bank selection unit 30 for generating an 8-bit bank number selection signal intaxp<0:7> based on the 8-bit bank number signal intaxpd<0:7> and a first and a second piled-refresh control signals tm_piledref<0> and tm_piledref<1>; a row address strobe (RAS) controller 40 for generating an 8-bit row active signal ratvbp13<0:7> and an 8-bit precharge signal rpcgbp13<0:7> based on the 8-bit bank selection signal intaxp<0:7> and an 8-bit control signal sadly<0:7>; and a control signal generator 50 for receiving the 8-bit row active signal ratvbp13<0:7> and the 8-bit precharge signal rpcgbp13<0:7> to generate the 8-bit control signal sadly<0:7>.

Herein, a signal with <0:7> actually includes eight signals from <0> to <7>. For instance, the 8-bit bank number signal intaxpd<0:7> includes eight bank number signals from intaxpd<0> to intaxpd<7>.

Figure 8:
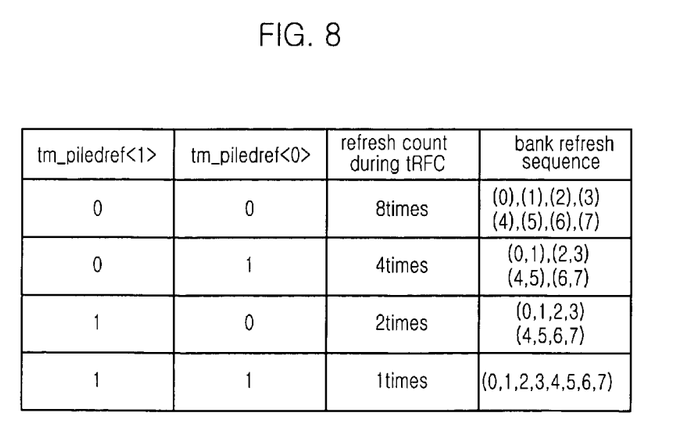
FIG. 8 is a table showing refresh operations according to a first and a second piled-refresh control signals.

The first and the second piled-refresh control signals tm_piledref<0> and tm_piledref<1> determine the number of banks to be refreshed together. Operations according to the first and the second piled-refresh control signals tm_piledref<0> and tm_piledref<1> are shown in FIG. 8. For instance, when the first and the second piled-refresh control signals tm_piledref<0> and tm_piledref<1> are respectively '1' and '0', the eight banks are grouped into four bank groups each of which includes two banks. Then, the eight banks are refreshed two by two. That is, firstly, the first and the second banks are refreshed together at the same time. Then, secondly, the third and the fourth banks are refreshed together, and so on. In this case, the refresh operation is performed four times for refreshing all the banks.

For another example, when the first and the second piled-refresh control signals tm_piledref<0> and tm_piledref<1> are respectively '0' and '1', the eight banks are grouped into two bank groups each of which includes four banks. Then, the eight banks are refreshed four by four. That is, firstly, the first to the fourth banks are refreshed together at the same time. Then, secondly, the fifth to the eighth banks are refreshed together. In this case, the refresh operation is performed two times for refreshing all the banks.

Figure 2:
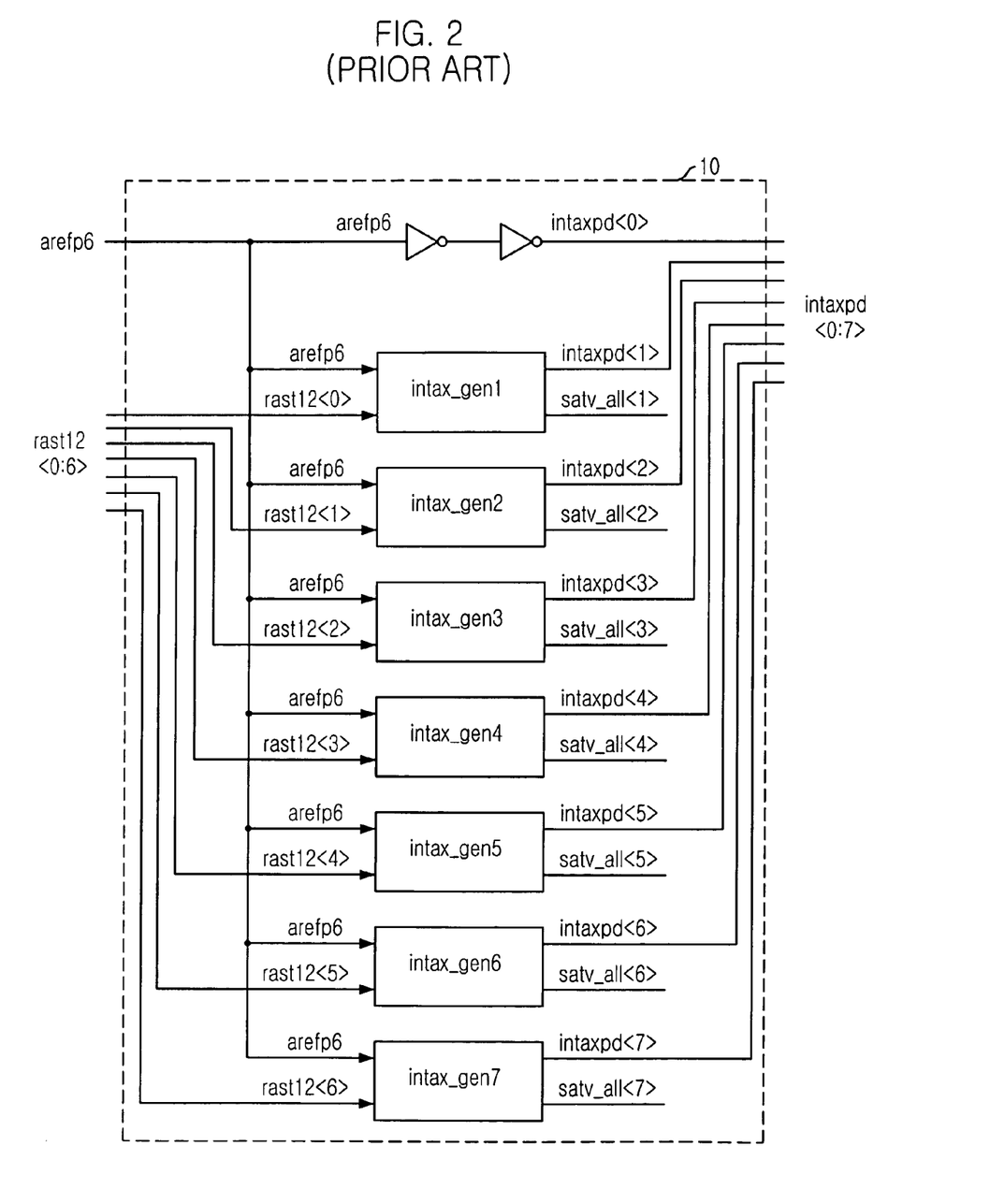
FIG. 2 is a block diagram showing a bank number signal generator shown in FIG. 1.

FIG. 2 is a block diagram showing the bank number signal generator 10 shown in FIG. 1.

As shown, the bank number signal generator 10 includes a plurality of inverters for delaying the refresh signal arefp6 to generate the bank number signal intaxpd<0>; and a plurality of internal bank number signal generators, i.e., a first internal bank number signal generator intax_gen1 to a seventh internal bank number signal generator intax_gen7, for generating the bank number signal intaxpd<1:7> based on the refresh signal arefp6 and a 7-bit reference signal rast12<0:6>.

Referring to FIGS. 1 and 2, operations of the conventional DRAM are described below. Herein, it is assumed that the eight banks are grouped into four banks groups to be refreshed, i.e., the first and the second piled-refresh control signals tm_piledref<0> and tm_piledref<1> are respectively '1' and '0'.

When the refresh signal arefp6 becomes a logic high level, the bank number signal intaxpd<0> also becomes a logic high level. At this time, i.e., when the bank number signal intaxpd<0> is logic high level, the bank selection unit 30 activates the bank selection signal intaxpd<0:1>. That is, the bank selection signals intaxpd<0> and intaxpd<1> are activated at the same time. Thereafter, in response to the bank selection signal intaxpd<0:1>, the RAS controller 40 activates the row active signal ratvbp13<0:1>. Thus, the first and the second banks can be refreshed in response to the row active signal ratvbp13<0:1>. Then, the precharge signal rpcgbp13<0:1> is activated for precharging the first and the second banks.

Thereafter, the reference signal rast12<0:1> is generated having a high pulse width which corresponds to a time period from the activation timing of the row active signal ratvbp13<0:1> to the activation timing of the precharge signal rpcgbp<0:1>. The reference signals rast12<0> and rast12<1> are respectively inputted to the first and the second internal bank number signal generators intax_gen1 and intax_gen2. Then, after a predetermined delay time, the bank number signal intaxpd<1:2> is generated. Thereafter, in response to the bank number signal intaxpd<2>, the bank selection unit 30 activates the bank selection signal intaxp<2:3>. Thus, in response to the bank selection signal intaxp<2:3>, the row active signal ratvbp13<2:3> is activated to thereby refresh the third and the fourth banks.

The other banks, i.e., the fifth to the eighth banks, can be refreshed according to the same method described above.

However, according to the conventional refresh control circuit, bank-to-bank refresh interval time is fixed to a predetermined interval time. That is, the predetermined interval time is determined by a bank-to-bank refresh interval time required for refreshing the banks one by one. As a matter of course, a power consumption is more increased when the banks are refreshed group by group. Therefore, it is desirable to increase the bank-to-bank refresh internal time when refreshing the banks group by group.

SUMMARY OF INVENTION

It is, therefore, an object of the present invention to provide a refresh control circuit for reducing power consumption when a plurality of banks are refreshed at the same time and a method thereof.

In accordance with an aspect of the present invention, there is provided a refresh control circuit for use in a semiconductor memory device having a plurality of banks, including: a bank number signal generator for generating a plurality of bank number signals having a predetermined delay time between generation timings of the plurality of bank number signals based on a refresh signal and a reference signal; and a bank selection unit for generating a plurality of bank selection signals in response to the plurality of bank number signals and a piled-refresh control signals to thereby refresh the plurality of banks.

In accordance with another aspect of the present invention, there is provided a refresh control method for a semiconductor memory device having a plurality of banks, including the steps of: a) generating a plurality of bank number signals having a predetermined delay time between generation timings of the plurality of bank number signals based on a refresh signal and a reference signal; b) generating a plurality of bank selection signals in response to the plurality of bank number signals and a piled-refresh control signals; and c) generating a plurality of row active signals and a plurality of precharge signals based on the plurality of bank selection signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a refresh control circuit for use in a semiconductor memory device in accordance with the present invention will be described in detail referring to the accompanying drawings.

The refresh control circuit in accordance with the present invention includes a bank number signal generator 10', a bank selection unit 30', a row address strobe (RAS) controller 40' and a control signal generator 50'. Herein, it is assumed that the semiconductor memory device includes eight banks, i.e., a first bank to an eighth bank, and the connection relations of the above-mentioned blocks are the same to those of the prior art.

The bank number signal generator 10' generates an 8-bit bank number signal intaxpd<0:7> in response to a refresh signal arefp6. Herein, the 8-bit bank number signal intaxpd<0:7> includes eight bank number signals from intaxpd<0> to intaxpd<7>. The bank number signals intaxpd<0> to intaxpd<7> are generated one by one having a predetermined delay time, i.e., $\Delta T$, between generation timings of the bank number signals intaxpd<0> to intaxpd<7>. That is, the bank number signal intaxpd<0> is generated firstly in response to the refresh signal arefp6. Then, after the predetermined delay time $\Delta T$, the bank number signal intaxpd<1> is generated. Likewise, the bank number signal intaxpd<2> is generated after the predetermined delay time $\Delta T$ is passes from the generation timing of the bank number signal intaxpd<1>. In the same manner, the other bank number signals are generated.

The bank selection unit 30 generates an 8-bit bank number selection signal intaxp<0:7> in response to the 8-bit bank number signal intaxpd<0:7> according to a first and a second piled-refresh control signals tm_piledref<0> and tm_piledref<1>. The first and the second piled-refresh control signals tm_piledref<0> and tm_piledref<1> determine the number of banks to be refreshed together. Operations according to the first and the second piled-refresh control signals tm_piledref<0> and tm_piledref<1> are shown in FIG. 8. For example, when the first and the second piled-refresh control signals tm_piledref<0> and tm_piledref<1> are respectively '1' and '0', the eight banks are grouped into four bank groups each of which includes two banks so as to refresh the eight banks two by two.

The bank selection unit 30 selectively activates the bank number selection signals intaxp<0> to intaxp<7> in order to selectively refresh the eight banks in response to the 8-bit bank number signal intaxpd<0:7>. For instance, when the eight banks are refreshed one by one, the bank selection unit 30 activates the bank number selection signal intaxp<0> firstly, and then activates the bank number selection signal intaxp<1> secondly, and so on. For another example, when the eight banks are refreshed two by two, the bank selection unit 30 activates the bank number selection signals intaxp<0> and intaxp<1> together at the same time, and then activates the bank number selection signals intaxp<2> and intaxp<3>, and so on.

Herein, when the bank selection signals intaxp<0> to intaxp<7> are activated sequentially one by one as described above, there is the predetermined delay time ΔT between the activation timings of the bank selection signals intaxp<0> to intaxp<7>, e.g., the bank selection signal intaxp<1> is activated after the predetermined delay time ΔT from the activating timing of the bank selection signal intaxp<0>. On the contrary, when the bank selection signals intaxp<0> to intaxp<7> are activated two by two, there is a delay time of 2×ΔT between the activation timings of the bank selection signals intaxp<0> to intaxp<7>. For instance, the bank selection signals intaxp<2> and intaxp<3> are activated after the delay time of 2×ΔT is passed from the activation timing of the bank selection signals intaxp<0> and intaxp<1>.

Operations of the bank selection unit 30 are described below in detail assuming that the eight banks are refreshed two by two.

When the bank number signal intaxpd<0> is activated, the bank selection unit 30 activates the bank selection signals intaxp<0> and intaxp<1> at the same time. After the predetermined delay time ΔT is passed from the activation timing of the bank number signal intaxpd<0>, the bank number signal intaxpd<1> is activated. At this time, however, the bank selection unit 30 does not activate any bank selection signal in response to the bank number signal intaxpd<1>. Then, after the predetermined delay time ΔT is passed from the activation timing of the bank number signal intaxpd<1>, the bank number signal intaxpd<2> is activated. In response to the bank selection signals intaxp<2> and intaxp<3> are activated at the same time. Consequently, the bank selection signals intaxp<2> and intaxp<3> are activated after the delay time of 2×ΔT is passed from the activation timing of the bank selection signals intaxp<0> and intaxp<1>. In the same manner, the bank selection signals intaxp<4> and intaxp<5> are activated after the delay time of 2×ΔT is passed from the activation timing of the bank selection signals intaxp<2> and intaxp<3>. Likewise, the bank selection signals intaxp<6> and intaxp<7> are activated after the predetermined delay time 2×ΔT from the activation timing of the bank selection signals intaxp<4> and intaxp<5>.

In case that the eight banks are refreshed four by four, the bank selection signals intaxp<0> to intaxp<3> are activated at the same time in response to the bank number signal intaxpd<0>. Then, after a delay time of 4×ΔT is passed from the activation timing of the bank selection signals intaxp<0> to intaxp<3>, the bank selection signals intaxp<4> to intaxp<7> are activated at the same time.

As a result, when the eight banks are refreshed group by group, a bank-to-bank refresh interval time is increased in proportion to the number of banks to be refreshed together.

Figure 3:
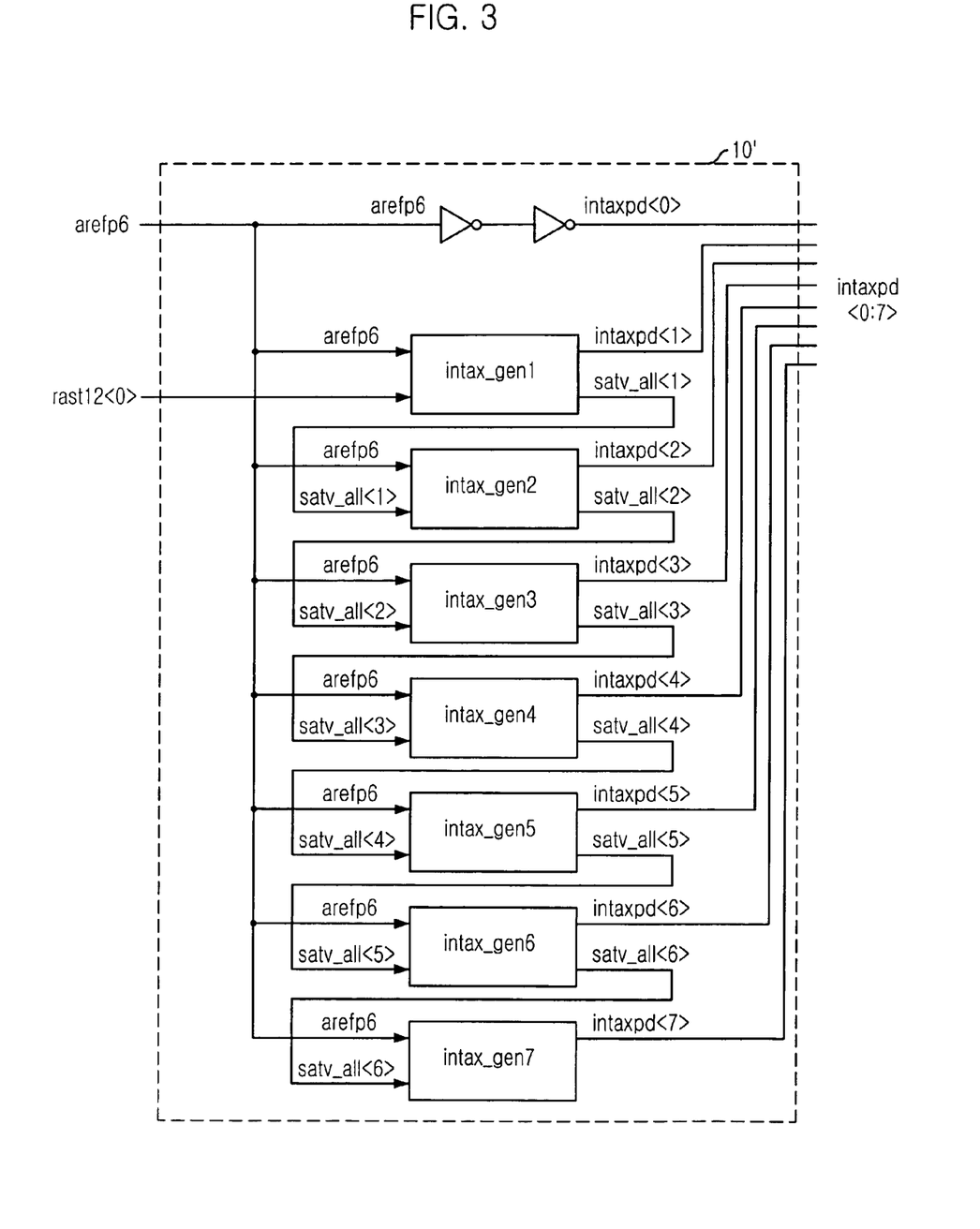
FIG. 3 is a block diagram showing a bank number signal generator in accordance with a first embodiment of the present invention.

FIG. 3 is a block diagram showing the bank number signal generator 10' in accordance with a first embodiment of the present invention.

As shown, the bank number signal generator 10' includes a plurality of inverters for delaying the refresh signal arefp6 to generate the bank number signal intaxpd<0>; and a plurality of internal bank number signal generators, i.e., a first internal bank number signal generator intax_gen1 to a seventh internal bank number signal generator intax_gen7, for generating the bank number signal intaxpd<1:7> based on the refresh signal arefp6 and a reference signal rast12<0>.

The first internal bank number signal generator intax_gen1 receives the reference signal rast12<0> for activating a first delay reference signal satv_all<1> and the bank number signal intaxpd<1> after the predetermined delay time ΔT. The first delay reference signal satv_all<1> is used as an enable signal of the second internal bank number signal generator intax_gen2. Then, after the predetermined delay time ΔT, the second internal bank number signal generator intax_gen2 activates the bank number signal intaxpd<2> and a second delay reference signal satv_all<2>. In the same manner, the other bank number signals and delay reference signals are generated.

The reference signal rast12<0> is employed for widening pulse width of the bank number signal intaxpd<1:7> to thereby stably operate the semiconductor memory device and also for minimizing a revision of the conventional refresh control circuit for embodiment of the present invention.

Figure 4:
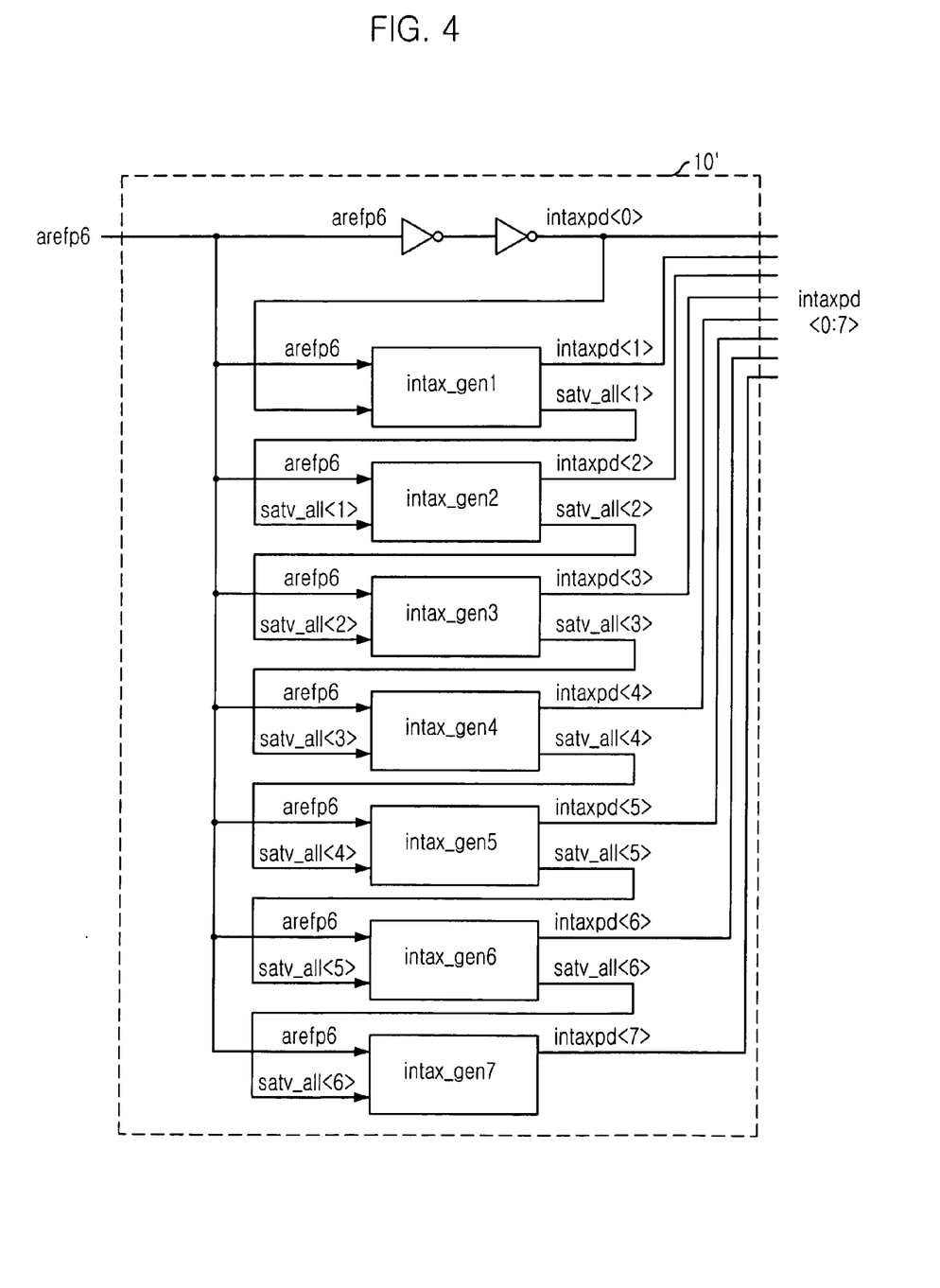
FIG. 4 is another block diagram showing the bank number signal generator in accordance with a second embodiment of the present invention.

FIG. 4 is another block diagram showing the bank number signal generator 10' in accordance with a second embodiment of the present invention.

As shown, the bank number signal generator 10' includes a plurality of inverters for delaying the refresh signal arefp6 to generate the bank number signal intaxpd<0>; and a plurality of internal bank number signal generators, i.e., a first internal bank number signal generator intax_gen1 to a seventh internal bank number signal generator intax_gen7, for generating the bank number signal intaxpd<1:7> based on the refresh signal arefp6 and the bank number signal intaxpd<0>.

In comparison with the bank number signal generator 10' shown in FIG. 3, the bank number signal generator 10' shown in FIG. 4 uses the bank number signal intaxpd<0> as an enable signal of the first internal bank number signal generator intax_gen1 instead of the reference signal rast12<0> for more simplifying an electric wiring. Since the bank number signal generator 10' shown in FIG. 4 has the same operations with the bank number signal generator 10' shown in FIG. 3, detailed operations of the bank number signal generator 10' shown in FIG. 4 are omitted.

Herein, for simplifying structure of the first to the seventh internal bank number generators intax_gen1 to intax_gen7, a previous bank number signal can be used as an enable signal of a next internal bank number generator. In this case, the first to the seventh delay reference signals satv_all<1> to satv_all<7> are replace with the bank number signal intaxpd<1:7>.

Figure 5:
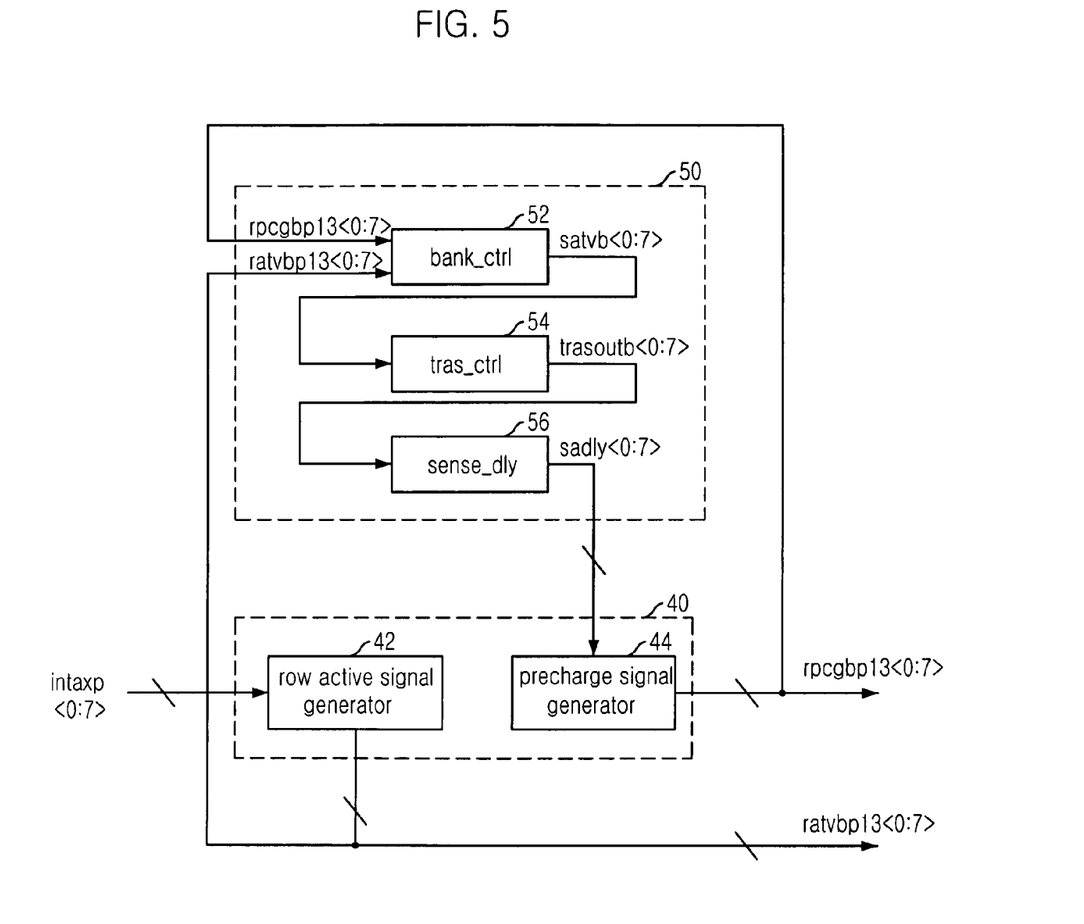
FIG. 5 is a block diagram showing a RAS controller and a control signal generator.

FIG. 5 is a block diagram showing the RAS controller 40' and the control signal generator 50'.

The RAS controller 40' includes a row active signal generator 42 for generating an 8-bit row active signal ratvbp13<0:7> in response to the 8-bit bank selection signal intaxpd<0:7>; and a precharge signal generator 44 for generating an 8-bit precharge signal rpcgbp13<0:7> in response to an 8-bit control signal sadly<0:7>.

The control signal generator 50' includes a first to a third signal control units 52 to 56.

The first signal control unit 52 receives the 8-bit precharge signal rpcgbp13<0:7> and the 8-bit row active signal ratvbp13<0:7> for generating an 8-bit first internal control signal satvb<0:7>. The 8-bit first internal control signal satvb<0:7> becomes logic low level when the 8-bit row active signal ratvbp13<0:7> is activated. Then, when the 8-bit first internal control signal satvb<0:7> is a logic low level, the second signal control unit 54 generates an 8-bit second internal control signal trasoutb<0:7> after a delay time of a RAS time tRAS. Thereafter, the third signal control unit 56 generates the control signal sadly<0:7> having an inverted pulse of the 8-bit second internal control signal trasoutb<0:7>. Then, in response to the control signal sadly<0:7>, the precharge signal generator 44 activates the 8-bit precharge signal rpcgbp13<0:7>. At this time, since the 8-bit precharge signal rpcgbp13<0:7> becomes activated, the 8-bit first internal control signal satvb<0:7> becomes logic high level.

Figure 6:
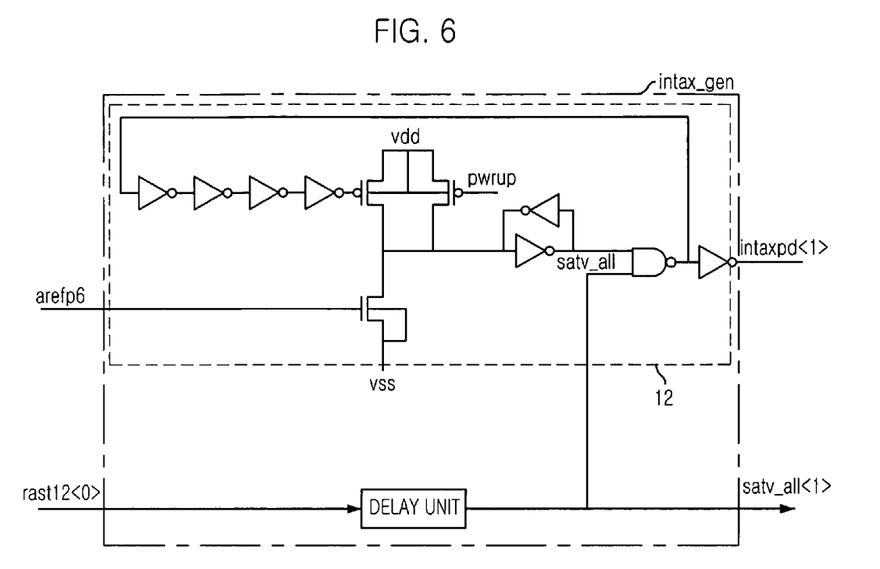
FIG. 6 is a schematic circuit diagram depicting one of a first to a seventh internal bank number signal generators included in the bank number signal generator.

FIG. 6 is a schematic circuit diagram depicting one of the first to the seventh internal bank number signal generator intax_gen1 to intax_gen7. Herein, the first internal bank number signal generator intax_gen1 is shown.

As shown, the first internal bank number signal generator intax_gen1 includes a delay unit for delaying the reference signal rastl2<0>; and a feed-bank unit 12 including a plurality of metal oxide semiconductor (MOS) transistors, a logic gate and a plurality of inverters. Once the second bank number signal is intaxpd<1> is activated, then the intaxpd<1> is inactivated after a predetermined time. That is, the second bank number signal intaxpd<1> has a constant pulse width.

Figure 7:
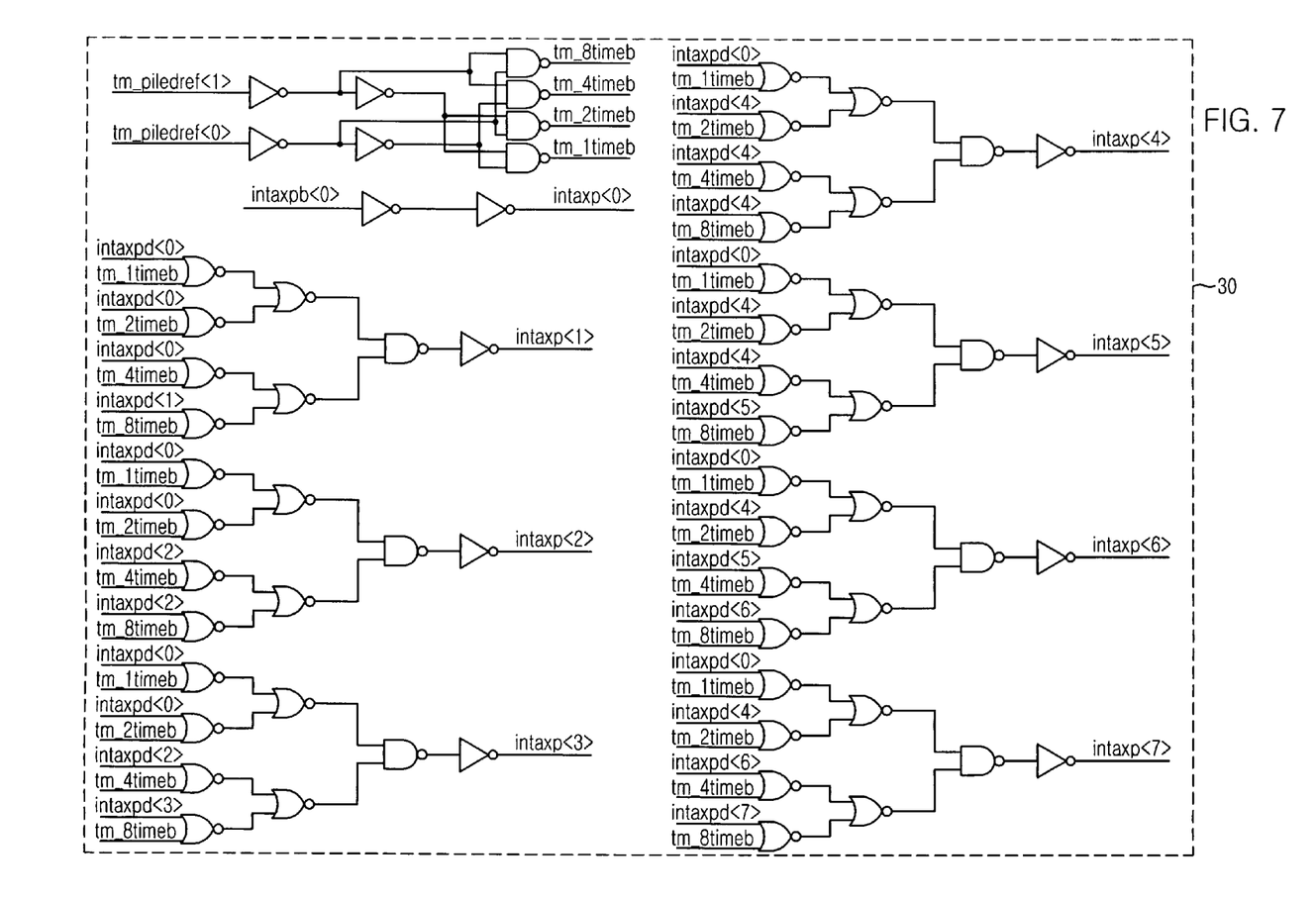
FIG. 7 is a schematic circuit diagram showing a bank selection unit.

FIG. 7 is a schematic circuit diagram showing the bank selection unit 30'.

As shown, the bank selection unit 30' includes a plurality of logic gates and inverters for generating the 8-bit bank selection signal intaxp<0:7> based on the 8-bit bank number signal intaxpd<0:7> and the first and the second piled-refresh control signals tm_piledref<0> and tm_piledref<1>. Since operations of the schematic circuit diagram shown in FIG. 7 are well known to those skilled art, detailed descriptions of the bank selection unit 30' are omitted.

FIG. 8 is a table showing refresh operations according to the first and the second piled-refresh control signals tm_piledref<0> and tm_piledref<1>. Herein, the first to the eighth banks are numbered from 0 to 7 respectively.

When the first and the second piled-refresh control signals tm_piledref<0> and tm_piledref<1> are respectively '1' and '0', the eight banks are refresh one by one from the first bank to the eighth bank. Herein, as above-mentioned, the bank-to-bank refresh interval time is the predetermined delay time ΔT.

When the first and the second piled-refresh control signals tm_piledref<0> and tm_piledref<1> are respectively '1' and '0', the eight banks are grouped into four bank groups each of which includes two banks. Then, the eight banks are refreshed two by two. That is, firstly, the first and the second banks are refreshed together at the same time. Then, secondly, the third and the fourth banks are refreshed together, and so on. In this case, the refresh operation is performed four times for refreshing all the banks. Herein, as above-mentioned, the bank-to-bank refresh interval time is the delay time of 2×ΔT.

When the first and the second piled-refresh control signals tm_piledref<0> and tm_piledref<1> are respectively '0' and '1', the eight banks are grouped into two bank groups each of which includes four banks. Then, the eight banks are refreshed four by four. That is, firstly, the first to the fourth banks are refreshed together at the same time. Then, secondly, the fifth to the eighth banks are refreshed together. In this case, the refresh operation is performed two times for refreshing all the banks. Herein, as above-mentioned, the bank-to-bank refresh interval time is the delay time of 4×ΔT.

When the first and the second piled-refresh control signals tm_piledref<0> and tm_piledref<1> are respectively '1' and '1', all the eight banks are refreshed at the same time.

Herein, the first and the second piled-refresh control signals tm_piledref<0> and tm_piledref<1> are generally fixed; however, the first and the second piled-refresh control signals tm_piledref<0> and tm_piledref<1> can be changed being configured by a mode register set (MRS).

Figure 9:
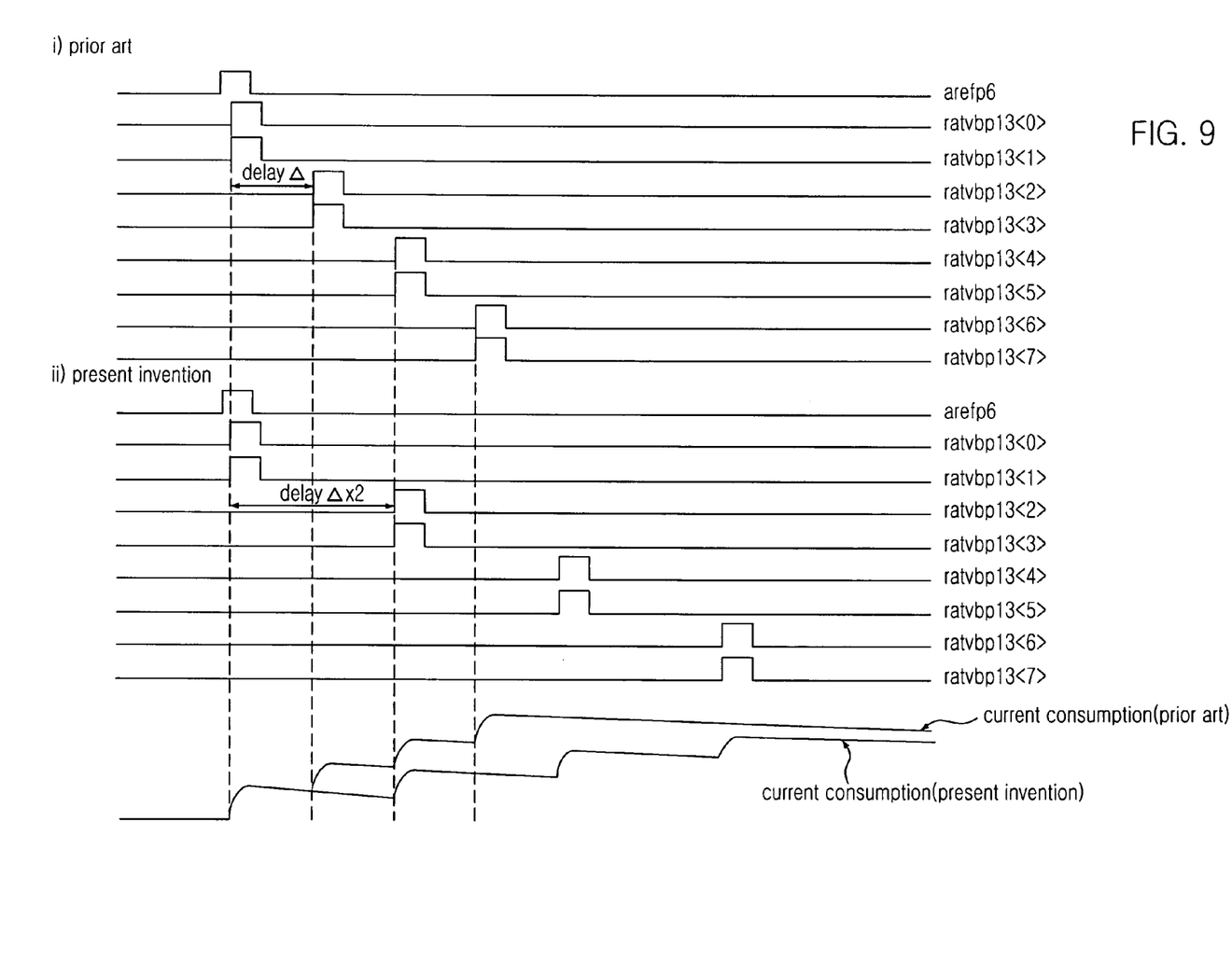
FIG. 9 is a timing diagram showing power consumptions during performing a refresh operation.

FIG. 9 is a timing diagram showing power consumptions during performing the refresh operation.

As shown, since the bank-to-bank refresh interval time is increased in proportion to the number of banks to be refreshed together, a power consumption of the preset invention is less than that of the prior art.

Therefore, in accordance with the present invention, it is prevented that a power consumption is rapidly increased during refreshing banks.

The present application contains subject matter related to Korean patent application No. 2004-29223, filed in the Korean Patent Office on Apr. 27, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A refresh control circuit for use in a semiconductor memory device having a plurality of banks, comprising:
 a bank number signal generator for generating a plurality of bank number signals having a predetermined delay time between generation timings of the plurality of bank number signals based on a refresh signal and a reference signal; and
 a bank selection unit for generating a plurality of bank selection signals in response to the plurality of bank number signals and a piled-refresh control signal to thereby refresh the plurality of banks,
 wherein a bank-to-bank refresh interval time is increased in proportion to the number of banks included in each of a plurality of banks groups.

2. The refresh control circuit as recited in claim 1, wherein the bank selection unit groups the plurality of banks into a plurality of bank groups each of which includes the numbers of banks more than one bank according to the piled-refresh control signal so as to refresh banks included in each of the plurality of bank groups together at the same time.

3. The refresh control circuit as recited in claim 2, wherein the number of the plurality of bank groups is determined by the piled-refresh control signal.

4. The refresh control circuit as recited in claim 3, wherein the bank number signal generator includes:
 a plurality of inverters connected in series for delaying the refresh signal in order to generate a first bank number signal; and
 a plurality of internal bank number signal generators for respectively generating a second to a last bank number signals and a plurality of delay reference signals in response to the refresh signal and the reference signal.

5. The refresh control circuit as recited in claim 4, wherein the plurality of internal bank number signal generators activate a next bank number signal after the predetermined delay time is passed from an activation timing of a previous bank number signal in response to the delay reference signals.

6. The refresh control circuit as recited in claim 5, wherein each of the plurality of internal bank number signal generators includes:
 a delay unit for delaying the reference signal for the predetermined delay time in order to generate one of the plurality of delay reference signals; and
 a feed-bank unit for generating one of the plurality of bank number signals in based on the refresh signal and the one of the plurality of delay reference signals.

7. The refresh control circuit as recited in claim 6, further comprising:
   a row address strobe (RAS) controller for generating a plurality of row active signals and a plurality of precharge signals based on the plurality of bank selection signals and a control signal; and
   a control signal generator for generating the control in response to the plurality of row active signals and the plurality of precharge signals.

8. The refresh control circuit as recited in claim 7, wherein the RAS controller includes:
   a row active signal generator for generating the plurality of row active signals based on the plurality of bank selection signals; and
   a precharge signal generator for generating the plurality of precharge signals based on the control signal.

9. The refresh control circuit as recited in claim 8, wherein the control signal generator includes:
   a first signal control unit for generating a first internal control signal in response to the plurality of row active signals and the plurality of precharge signals;
   a second signal control unit for generating a second internal control signal based on the first internal control signal; and
   a third signal control unit for generating the control signal based on the second internal control signal.

10. The refresh control circuit as recited in claim 9, wherein the piled-refresh control signal is configured by a mode register set (MRS).

11. A refresh control method for a semiconductor memory device having a plurality of banks, comprising the steps of:
    a) generating a plurality of bank number signals having a predetermined delay time between generation timings of the plurality of bank number signals based on a refresh signal and a reference signal;
    b) generating a plurality of bank selection signals in response to the plurality of bank number signals and a piled-refresh control signal; and
    c) generating a plurality of row active signals and a plurality of precharge signals based on the plurality of bank selection signals,
    wherein a bank-to-bank refresh interval time is increased in proportion to the number of banks included in each of a plurality of bank groups.

12. The refresh control method as recited in claim 11, wherein the step of a) further includes the steps of:
    d) generating a first bank number signal by delaying the refresh signal; and
    e) generating a second to a last bank number signals having the predetermined delay time between generation timings of the second to the last bank number signals and generating a plurality of delay reference signals.

13. The refresh control method as recited in claim 12, wherein the step of e) further includes the steps of:
    f) generating the second bank number signal and a first delay reference signal in response to a reference signal; and
    g) generating a next bank number signal in response to a previous delay reference signal after the predetermined delay time is passed from a generation timing of a previous bank number signal.

* * * * *

UNITED STATES PATENT AND TRADEMARK OFFICE
CERTIFICATE OF CORRECTION

PATENT NO.         : 7,145,827 B2                                                    Page 1 of 1
APPLICATION NO. : 11/020803
DATED              : December 5, 2006
INVENTOR(S)        : Kwak et al.

It is certified that error appears in the above-identified patent and that said Letters Patent is hereby corrected as shown below:

In claim 1, column 8, line 33, please delete "banks" and insert -- bank --.

Signed and Sealed this

Seventh Day of August, 2007

JON W. DUDAS
*Director of the United States Patent and Trademark Office*